US006614100B1

(12) United States Patent
Hauser et al.

(10) Patent No.: US 6,614,100 B1
(45) Date of Patent: Sep. 2, 2003

(54) LEAD FRAME FOR THE INSTALLATION OF AN INTEGRATED CIRCUIT IN AN INJECTION-MOLDED PACKAGE

(75) Inventors: Christian Hauser, Regensburg (DE); Helge Schmidt, Speyer (DE); Johann Winderl, Neunburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/220,745

(22) Filed: Dec. 23, 1998

Related U.S. Application Data

(63) Continuation of application No. PCT/DE97/01314, filed on Jun. 24, 1997.

(30) Foreign Application Priority Data

Jun. 24, 1996 (DE) ......................... 196 25 228

(51) Int. Cl.[7] .................. H05K 7/20; H01L 23/495; H01L 23/34
(52) U.S. Cl. .................. 257/666; 257/696; 257/698; 257/787; 257/790; 257/788; 257/684; 257/796; 257/784; 257/693; 257/692; 257/730; 257/795; 174/50; 361/709
(58) Field of Search ................ 257/666, 696, 257/698, 693, 692, 796, 787, 788, 790, 730, 684, 795; 174/50; 361/709

(56) References Cited

U.S. PATENT DOCUMENTS

| | | | |
|---|---|---|---|
| 4,709,254 A | | 11/1987 | Haghiri-Tehrani et al. |
| 4,801,561 A | * | 1/1989 | Sankhagowit ............... 29/835 |
| 4,907,061 A | | 3/1990 | Kohara |
| 5,155,901 A | * | 10/1992 | Fierkens ..................... 29/827 |
| 5,244,840 A | | 9/1993 | Kodai et al. |
| 5,317,479 A | * | 5/1994 | Pai et al. |
| 5,328,870 A | * | 7/1994 | Marrs |
| 5,394,010 A | * | 2/1995 | Tazawa et al. .............. 257/686 |
| 5,420,752 A | * | 5/1995 | Variot ........................ 257/718 |
| 5,427,938 A | * | 6/1995 | Matsumura et al. |
| 5,444,294 A | * | 8/1995 | Suzuki ....................... 257/666 |
| 5,448,824 A | * | 9/1995 | Groves et al. ................ 29/827 |
| 5,451,716 A | * | 9/1995 | Hasegawa et al. ......... 174/52.4 |
| 5,455,462 A | * | 10/1995 | Marrs ......................... 257/796 |
| 5,459,641 A | * | 10/1995 | Kuriyama |
| 5,474,958 A | * | 12/1995 | Djennas et al. ............ 257/676 |
| 5,529,676 A | * | 6/1996 | Maley et al. .................. 24/409 |
| 5,554,823 A | * | 9/1996 | Hasegawa ................... 174/52.4 |
| 5,596,224 A | * | 1/1997 | Murphy et al. ............. 257/666 |
| 5,625,221 A | * | 4/1997 | Kim et al. ................... 257/686 |
| 5,635,760 A | * | 6/1997 | Ishikawa ..................... 257/692 |
| 5,682,673 A | * | 11/1997 | Fehr ............................ 257/696 |
| 5,715,872 A | * | 2/1998 | Hinterlechner .............. 140/105 |
| 5,723,903 A | * | 3/1998 | Masuda et al. ............. 257/696 |
| 5,767,443 A | * | 6/1998 | Farnworth et al. ............ 174/50 |
| 5,869,883 A | * | 2/1999 | Mehringer et al. ......... 257/667 |
| 5,895,969 A | * | 4/1999 | Masuda ....................... 257/696 |
| 5,895,970 A | * | 4/1999 | Miyoshi ...................... 257/696 |
| 5,945,130 A | * | 8/1999 | Saxelby, Jr. et al. ........ 425/112 |
| 5,946,231 A | * | 8/1999 | Endoh et al. ........... 365/185.03 |
| 5,952,715 A | * | 9/1999 | Sekiguchi et al. .......... 257/696 |
| 5,970,323 A | * | 10/1999 | Steijer et al. ................ 438/127 |
| 6,081,424 A | * | 6/2000 | Mach et al. ................. 257/707 |
| 6,151,220 A | * | 11/2000 | Sakamoto et al. .......... 257/723 |
| 6,252,302 B1 | * | 6/2001 | Farnworth .................. 257/723 |

FOREIGN PATENT DOCUMENTS

| | | |
|---|---|---|
| EP | 0 277 854 A1 | 8/1988 |
| EP | 0 340 100 A1 | 11/1989 |
| FR | 2 520 541 | 7/1983 |
| JP | 1-272142 | * 10/1989 |

OTHER PUBLICATIONS

"Technique For Thermally Enhancing Tab", IBM Technical Disclosure Bulletin, vol. 33, No. 3A, Aug. 1990, pp. 354–356.

"Composite Card to Provide Uniform Cooling to Single Chip Modules with Large Z Tolerance", IBM Technical Bulletin, vol. 36, No. 6A, Jun. 1993, pp. 333–334.

* cited by examiner

*Primary Examiner*—Alexander O. Williams
(74) *Attorney, Agent, or Firm*—Lawrence A. Greenberg; Werner H. Stemer; Ralph E. Locher

(57) ABSTRACT

The lead frame has a spring element, which can be compressed during the injection molding of the package by an injection mold. The resultant resilience has the effect that a contact surface of the lead is pressed against an inside wall of the injection mold. The biasing of the contact surface against the inside wall prevents polymer flash from forming on the contact surface. Also, the spring element fixes the lead during the injection operation and anchors the lead in the completed package. Hold-down pins within the injection mold are thus obviated.

8 Claims, 2 Drawing Sheets

LEAD FRAME FOR THE INSTALLATION OF AN INTEGRATED CIRCUIT IN AN INJECTION-MOLDED PACKAGE

CROSS-REFERENCE TO RELATED APPLICATIONS

This is a continuation of copending international application PCT/DE97/01314, filed on Jun. 24, 1997, which designated the United States.

BACKGROUND OF THE INVENTION

Field of the Invention

The invention relates to a lead frame for the installation of an integrated circuit in an injection-molded package. The lead frame has a lead (i.e., a conductor element for electrically connecting the integrated circuit) provided with a contact surface. After the completion of the injection-molded package, the contact surface becomes an external contact for electrically bonding the integrated circuit from outside the package.

Particularly if the injection-molded package is a chip card or the like, it is sometimes desirable for the contact surfaces not to be in the direct vicinity of the integrated circuit in the injection-molded package. This has the result that the leads extend relatively far within the package or on its surface. The packages are usually produces with a two-part injection mold which has a cavity into which the integrated circuit, with the lead frame connected to it, is inserted. The integrated circuit is thereby usually provided with a thermoset enclosure (the so-called mold body), from which the leads with the contact surfaces protrude. In the case of so-called in-mold labeling, a decorative film or label is placed on each of two sides of the cavity formed in the injection mold. Between the two decorative films and in direct contact with them is the enclosure of the integrated circuit. The actual card body is then produced by forcing a thermoplastic polymer into the cavity which remains between the two decorative films.

This may result in two undesirable effects: On the one hand, the relatively long leads that protrude from the enclosure of the integrated circuit may be deformed by the relatively high injection pressure (sometimes far in excess of 1000 bar) during the injection of the thermoplastic polymer composition. On the other hand, there is the risk of so-called flash forming on the contact surfaces of the leads, whereby a thin film of thermoplastic polymer composition is formed on the contact surfaces. This is, of course, disadvantageous, since the contact surfaces must be free from polymer for the later electrical bonding. The flash is removed by detaching the thin polymer film from the contact surfaces by a cleaning process. Another prior art solution that prevents flash formation is to use thin hold-down pins, which are component parts of the injection mold and, when the halves of the injection mold are fitted together, press the contact surfaces through the cavity formed as a result against one of the inside walls of the injection mold. The thermoplastic polymer is thereby prevented from getting onto that side of the contact surface which is in contact with the inside of the injection mold. However, the hold-down pins are associated with the disadvantage that, after injecting the polymer composition into the cavity and subsequently removing the hold-down pins, holes remain in the injection-molded package thus produced.

SUMMARY OF THE INVENTION

It is accordingly an object of the invention to provide a lead frame for mounting an integrated circuit in an injection molded package, which overcomes the above-mentioned disadvantages of the heretofore-known devices and methods of this general type and which specifies another solution with which the formation of polymer flash on the contact surfaces of the leads can be avoided.

With the foregoing and other objects in view there is provided, in accordance with the invention, a lead frame for mounting an integrated circuit in an injection-molded package, comprising:

at least one lead formed with a contact face for electrically bonding an integrated circuit;

the at least one lead including a spring element to be compressed during an injection molding of the package in an injection mold, whereby the contact surface is pressed against an inside wall of the injection mold during the injection molding.

In other words, each lead is provided with a spring element that can be compressed by the injection mold during the injection molding of the package. The resultant force of the compressed spring element has the effect that the contact surfaces of the leads are biased against the inside wall of the injection mold. The compression is a resilient, reversible deformation of the spring element.

The spring elements according to the invention render the use of the prior art hold-down pins unnecessary. This overcomes the associated disadvantages of more complex handling of the injection mold, and the holes produced in the injection-molded package after removal of the hold-down pins are avoided. Nevertheless, because the contact surface, and consequently the lead, is fixed, flash formation on the contact surfaces and deformation of the leads during the injection of the polymer composition into the injection mold are avoided by the invention.

In accordance with an added feature of the invention, the spring element is integrally formed at one end of the lead.

In accordance with an additional feature of the invention, the spring element is a hook anchoring the lead in the package after completion thereof.

In accordance with another feature of the invention, the spring element is a J-shaped element. In the alternative, the spring element has a semicircular shape.

In accordance with a further feature of the invention, the spring element is at least partially zigzag-shaped.

In accordance with again a further feature of the invention, the spring element is disposed in vicinity of the contact surface.

In accordance with a concomitant feature of the invention, the injection mold is formed with two injection mold halves defining a given thickness of the package, and wherein the spring element projects relative to the contact surface by more than the given thickness of the package.

If the spring element is designed in the form of a hook, at the same time an anchoring of the lead in the package can be achieved. Consequently, coming away of the lead, or the contact surface, as a result of mechanical or thermal loading of the completed package can be avoided.

Although the invention is illustrated and described herein as embodied in a lead frame for the installation of an integrated circuit in an injection-molded package, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
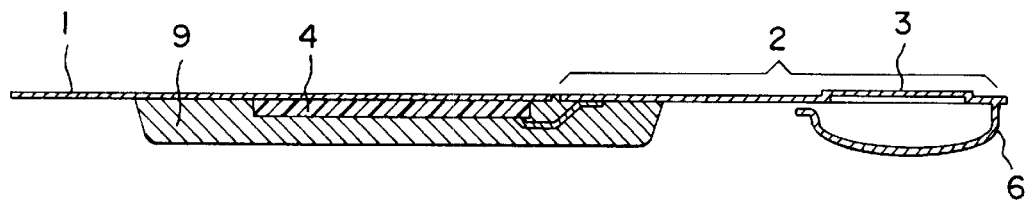
FIG. 1a is a sectional view through a first exemplary embodiment of the lead frame according to the invention.

Referring now to the figures of the drawing in detail and first, particularly, to FIG. 1a thereof, there is seen a lead frame 1 in a sectional representation from the side. The lead frame 1 has leads 2, of which only one can be seen in FIG. 1a, on account of the elevational representation. An integrated circuit 4 is connected to the lead frame 1. The integrated circuit 4 is enclosed, for protection, in an enclosure 9. Typically, the enclosure 9 consists of a thermoset material (mold body) and it is located only on one side of the lead frame 1.

Figure 1B:
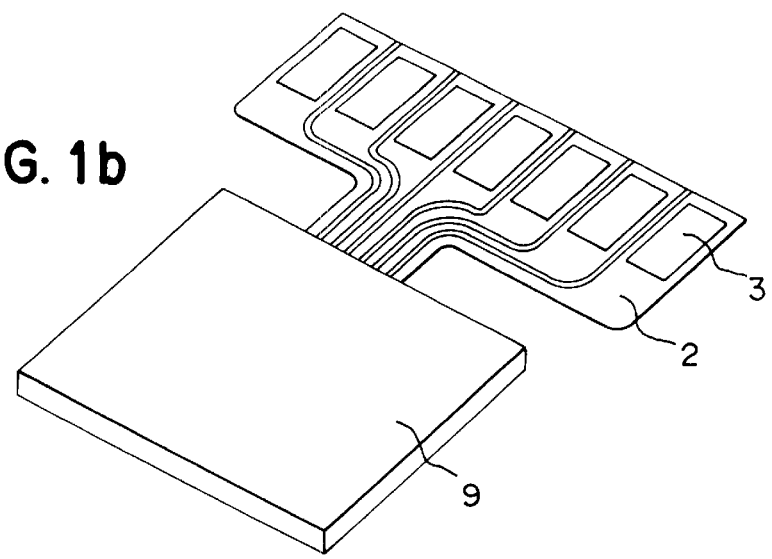
FIG. 1b is a perspective view thereof.

FIG. 1b shows the assembly of FIG. 1a in a perspective view. The enclosure 9 is shown once more, and a multiplicity of leads 2. The leads serve in each case as a contact surface 3 for later external electrical bonding of the integrated circuit from outside an injection-molded package still to be produced. The invention will be explained below with reference to one of the leads 2, whereby it is understood that all of the leads of the lead frame 1 can be designed in the same way.

Again with reference to FIG. 1a, the lead 2 has a free end, distally from the enclosure 9, with an approximately semicircular spring element 6. The resiliency is produced by pressure from below on the spring element 6 in the direction of the contact surface 3 (FIG. 1a). It is particularly favorable if the spring element 6 is disposed in the vicinity of the contact surface 3, as shown in FIG. 1a. In this way, a force exerted on the spring element 6 is optimally transferred to the contact surface 3. The function of the spring element 6 will be understood from the following description of a production process for an injection-molded package for the integrated circuit 4 with the lead frame 1.

Figure 2:
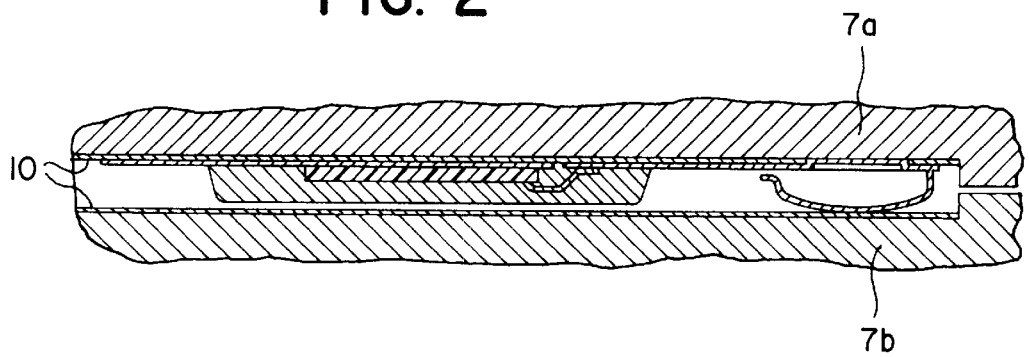
FIGS. 2, 3, and 4 are partial sectional views showing various production steps during the production of a package for an integrated circuit connected to the lead frame.

FIG. 2 shows the assembly of FIG. 1a after it has been introduced into an injection mold 7a, 7b having an upper mold half 7a and a lower mold half 7b. The two mold halves 7a, 7b of the injection mold are not yet completely closed and, accordingly, no force is yet being exerted on the spring element 6. One possible method of producing an injection-molded package is so-called in-mold labeling, which is explained here. In this case, two opposite inside faces of the injection mold 7a, 7b are each provided with a thermoplastic decorative film 10. The lead frame 1 with the chip 4 and the enclosure 9 is introduced between the films 10 when the injection mold 7a, 7b is fitted together. As clearly shown in FIG. 2, the spring element 6 of the exemplary embodiment advantageously projects beyond the thickness of the enclosure 9. Therefore, the lower mold half 7b is already in contact with the spring element 6, but not yet with the enclosure 9. As will be seen below, the thickness of the enclosure 9, disregarding the decorative film 10, corresponds exactly to the thickness of the injection-molded package to be produced. The spring element 6 thus projects beyond the thickness of the injection-molded package to be produced, i.e., the "thickness" of the relaxed spring element is greater than the thickness of the final package.

Figure 3:
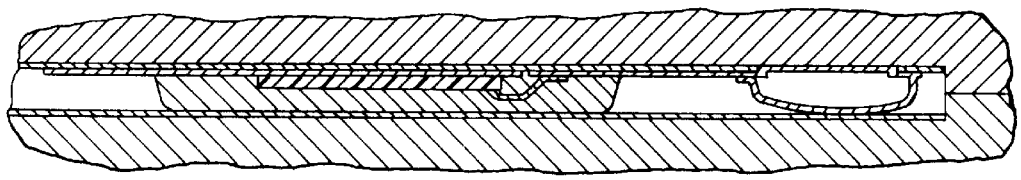

FIG. 3 shows the injection mold 7a, 7b after the final fitting together. The projection of the spring element 6 has the effect that it is compressed during fitting together. The resilience brought about as a result causes the contact surface 3 to be pressed against an inside wall 8 of the upper mold half 7a. During the subsequent injection of a thermoplastic polymer composition into the cavity remaining in the injection mold 7a, 7b, it is ensured by the spring element 6 that the contact surface 3 rests flat against the inside wall 8 on its upper side, at which the integrated circuit will later be externally bonded. No polymer composition can enter in between the two opposing surfaces 8 and 3.

Figure 4:
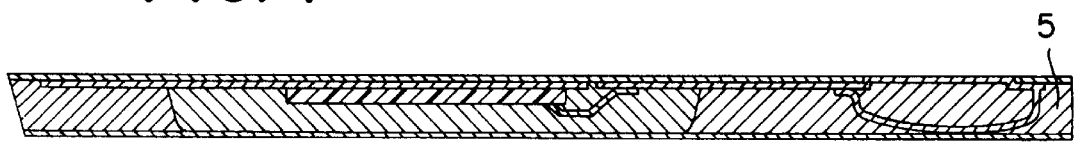

FIG. 4 shows the completed injection-molded package 5 after the injection mold 7a, 7b has been removed. The upper side of the contact surface 3 is free from polymer. Furthermore, the lead 2 is held or fixed during the injection operation by the resilience of the compressed spring element 6, so that deformation of the lead 2 during production of the package is avoided. A further advantage of the spring element 6 according to the invention is that, on account of its shaping, the lead 2 is anchored in the injection-molded package 5. This has the effect that, even if flexural or torsional loads occur on the injection-molded package 5, coming away of the contact surface 3 from the package 5 is avoided. If, as explained with reference to the exemplary embodiment, the spring element 6 is part of the lead 2, a possibly undesired further contact on the underside of the package 5 via the spring element 6 is prevented by the presence of the lower decorative film 10, which covers the spring element 6 from below.

Figure 5:
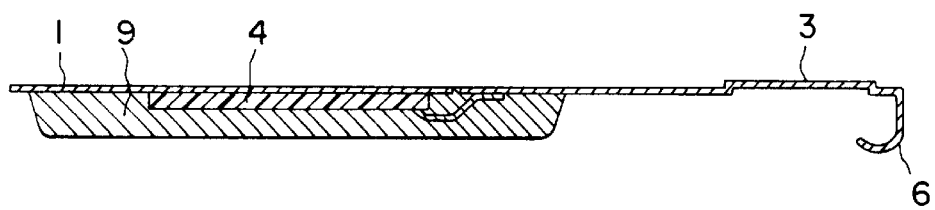
FIGS. 5 and 6 are sectional views through further exemplary embodiments of the lead frame according to the invention.

FIG. 5 illustrates an alternative exemplary embodiment of the invention. Here, the spring element 6 is once more a component part of the lead 2 and is disposed in the direct vicinity of the contact surface 3. The spring element is not semicircular in this embodiment, but instead it takes the form of J. This embodiment of the invention which is more simple to produce, leads to the same advantages: the formation of flash films on the upper side of the contact surface 3 is prevented, bending of the lead 2 during the injection operation is prevented and the lead 2 is anchored, and consequently also the contact surface 3, in the completed injection-molded package 5.

The invention is particularly suitable for producing very thin injection-molded packages 5. Of particular interest are chip cards and similar packages.

The invention permits the use of an injection mold without hold-down pins, which are prone to wear. Holes in the completed injection-molded package are avoided as well.

Figure 6:
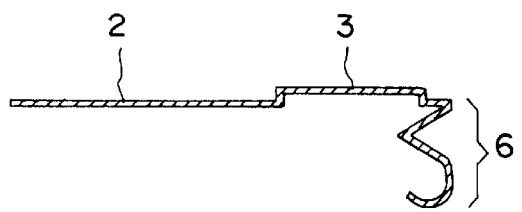

FIG. 6 illustrates yet another exemplary embodiment of the invention. Only part of the lead frame 1 is represented, to be precise part of the lead 2 with the contact surface 3 and the spring element 6, which is a component part of the lead 2 in the case of this exemplary embodiment as well. Here, the spring element 6 is in zigzag form at the end of the lead 2, thereby bringing about a particularly favorable resilient behavior. The end of the spring element 6 is again configured in the form of a J, in order to achieve an additional anchoring of the lead 2 in the completed package 5 and to offer a good engaging surface for the injection mold 7a, 7b.

We claim:

1. A lead frame formed by injection molding in a mold having an inside wall, the lead frame comprising:

an integrated circuit;

an enclosure encapsulating said integrated circuit; and at least one lead formed with a contact face electrically bonded to said integrated circuit;

said at least one lead including a spring element opposing said contact face compressed during the injection molding in the injection mold, whereby said contact surface is pressed against the inside wall of the injection mold during the injection molding.

2. The lead frame according to claim 1, wherein said spring element is integrally formed at one end of said lead.

3. The lead frame according to claim 1, wherein said spring element is a hook anchoring said lead in the package after completion thereof.

4. The lead frame according to claim 3, wherein said spring element is a J-shaped element.

5. The lead frame according to claim 3, wherein said spring element has a semicircular shape.

6. The lead frame according to claim 1, wherein said spring element is at least partially zigzag-shaped.

7. The lead frame according to claim 1, wherein said spring element is disposed in vicinity of said contact surface.

8. The lead frame according to claim 1, wherein the injection mold is formed with two injection mold halves defining a given thickness of the package, and wherein said spring element projects relative to said contact surface by more than the given thickness of the package.

* * * * *